US008106383B2

(12) United States Patent
Jenkins et al.

(10) Patent No.: US 8,106,383 B2
(45) Date of Patent: Jan. 31, 2012

(54) SELF-ALIGNED GRAPHENE TRANSISTOR

(75) Inventors: Keith A. Jenkins, Yorktown Heights, NY (US); Yu-Ming Lin, Yorktown Heights, NY (US); Alberto Valdes-Garcia, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 96 days.

(21) Appl. No.: 12/617,770

(22) Filed: Nov. 13, 2009

(65) Prior Publication Data
US 2011/0114919 A1 May 19, 2011

(51) Int. Cl.
*H01L 29/16* (2006.01)
*H01L 21/04* (2006.01)
*H01L 51/30* (2006.01)

(52) U.S. Cl. ....... 257/29; 257/24; 257/57; 257/E29.082; 257/E21.051; 257/E51.038; 438/105; 438/164; 438/197

(58) Field of Classification Search .............. 257/24, 257/29, 57, E29.082, E21.051, E51.038; 438/105, 164, 197
See application file for complete search history.

(56) References Cited

U.S. PATENT DOCUMENTS

| 5,466,637 | A | 11/1995 | Kim |
| 6,784,553 | B2 | 8/2004 | Zedlitz et al. |
| 7,087,479 | B2 | 8/2006 | Swanson et al. |
| 7,327,000 | B2 | 2/2008 | DeHeer et al. |
| 7,772,059 | B2 * | 8/2010 | Parikh et al. ............ 438/198 |
| 2009/0020764 | A1 | 1/2009 | Anderson et al. |
| 2009/0140801 | A1 | 6/2009 | Ozyilmaz et al. |
| 2009/0155963 | A1 | 6/2009 | Hawkins et al. |
| 2009/0181502 | A1 * | 7/2009 | Parikh et al. ............ 438/164 |
| 2010/0051960 | A1 * | 3/2010 | Chen et al. .............. 257/76 |
| 2010/0090759 | A1 * | 4/2010 | Shin et al. ............... 327/581 |
| 2010/0285639 | A1 * | 11/2010 | Garcia et al. ............ 438/151 |
| 2010/0301336 | A1 * | 12/2010 | Babich et al. ............ 257/57 |
| 2011/0017979 | A1 * | 1/2011 | Meric et al. ............. 257/29 |
| 2011/0042650 | A1 * | 2/2011 | Avouris et al. .......... 257/29 |
| 2011/0068323 | A1 * | 3/2011 | Chen et al. ............. 257/24 |
| 2011/0101308 | A1 * | 5/2011 | Avouris et al. .......... 257/27 |
| 2011/0101309 | A1 * | 5/2011 | Lin et al. ............... 257/29 |
| 2011/0108806 | A1 * | 5/2011 | Davidovic et al. ....... 257/29 |

FOREIGN PATENT DOCUMENTS

DE 102008042323 A1 4/2009
EP 0849785 A3 12/1998

OTHER PUBLICATIONS

K.L.Shepard et al., Characterization and Modeling of Graphene Field-Effect Devices, IEEE, May 2008, pp. 406-411, Columbia University, New York, NY.
I. Meric, et al., "Current saturation in zero-bandgap, top-gated graphene field-effect transistors," Nature Nanotechnology, vol. 3; Nov. 2008, pp. 654-659. Ragan-Kelly, et al., "Building a Metallic Graphene Transistor," Deas Reau, Havard University; 2005 pp. 1-7.
International Search Report; International Application No. PCT/EP2010/062703; International Filing Date: Aug. 31, 2010; Date of Mailing: Oct. 26, 2010; 4 pages.
Written Opinion of the International Searching Authority; International Application No. PCT/EP2010/062703; International Filing Date: Aug. 31, 2010; Date of Mailing: Oct. 26, 2010; 6 pages.

* cited by examiner

*Primary Examiner* — Victor A Mandala
(74) *Attorney, Agent, or Firm* — Cantor Colburn LLP; Vazken Alexanian

(57) ABSTRACT

A graphene field effect transistor includes a gate stack, the gate stack including a seed layer, a gate oxide formed over the seed layer, and a gate metal formed over the gate oxide; an insulating layer; and a graphene sheet displaced between the seed layer and the insulating layer.

17 Claims, 9 Drawing Sheets

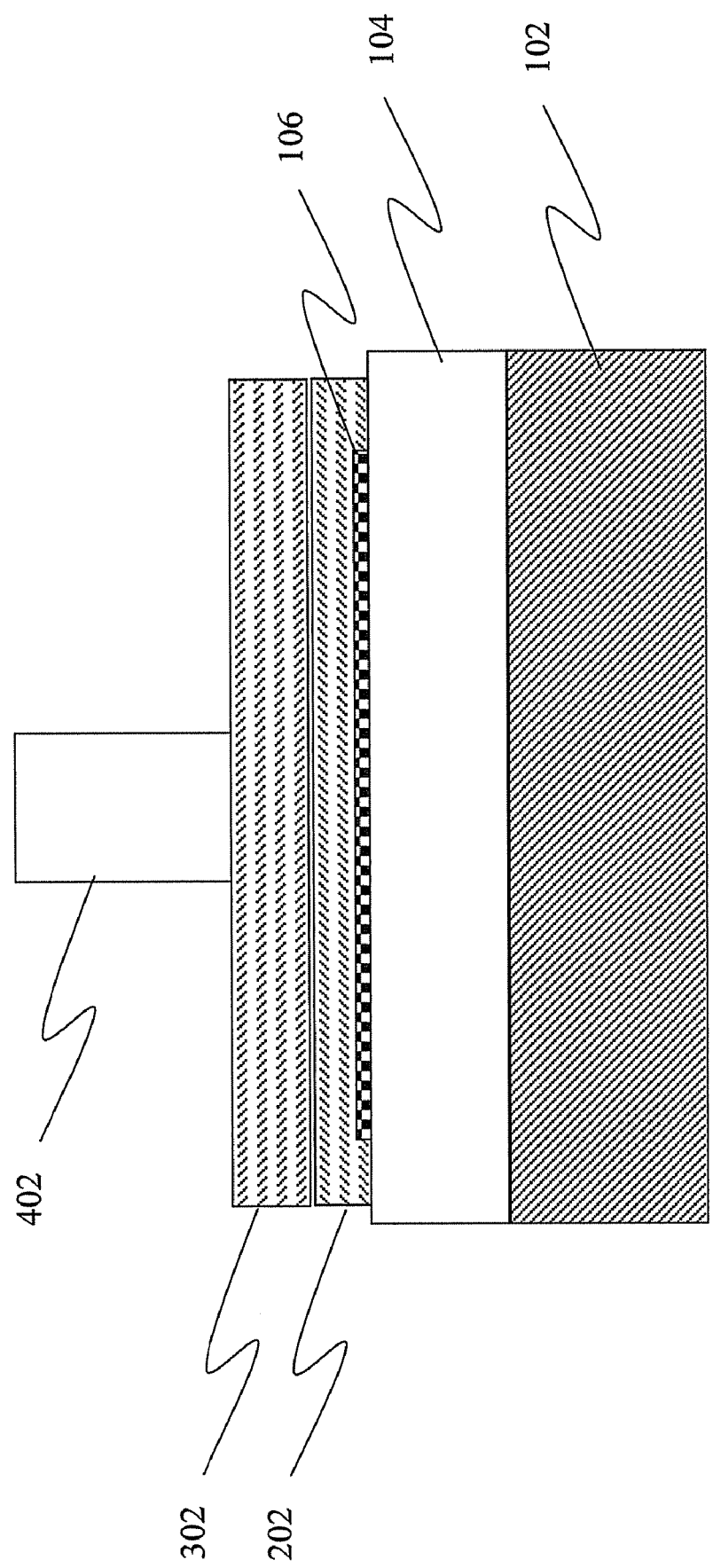

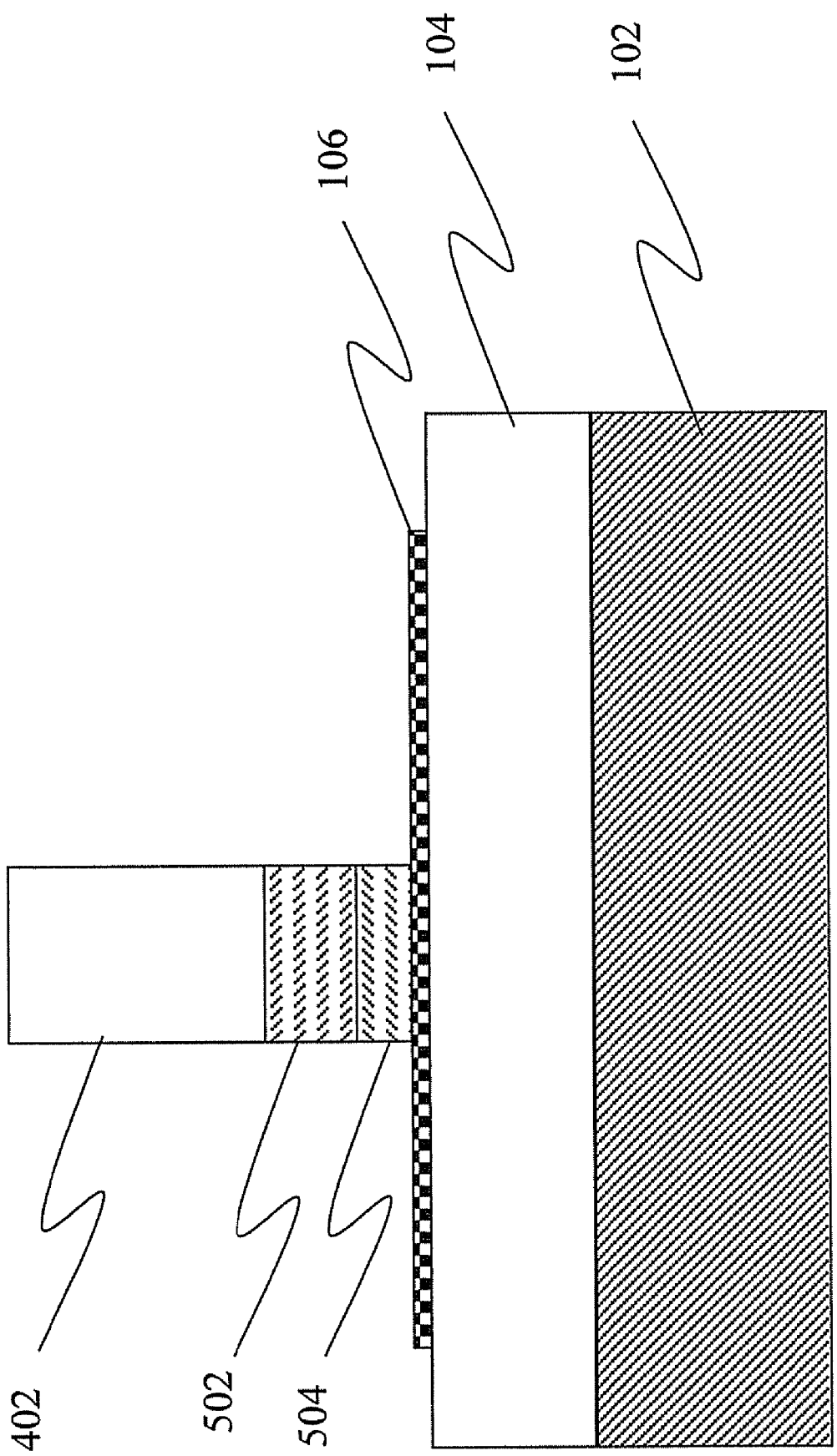

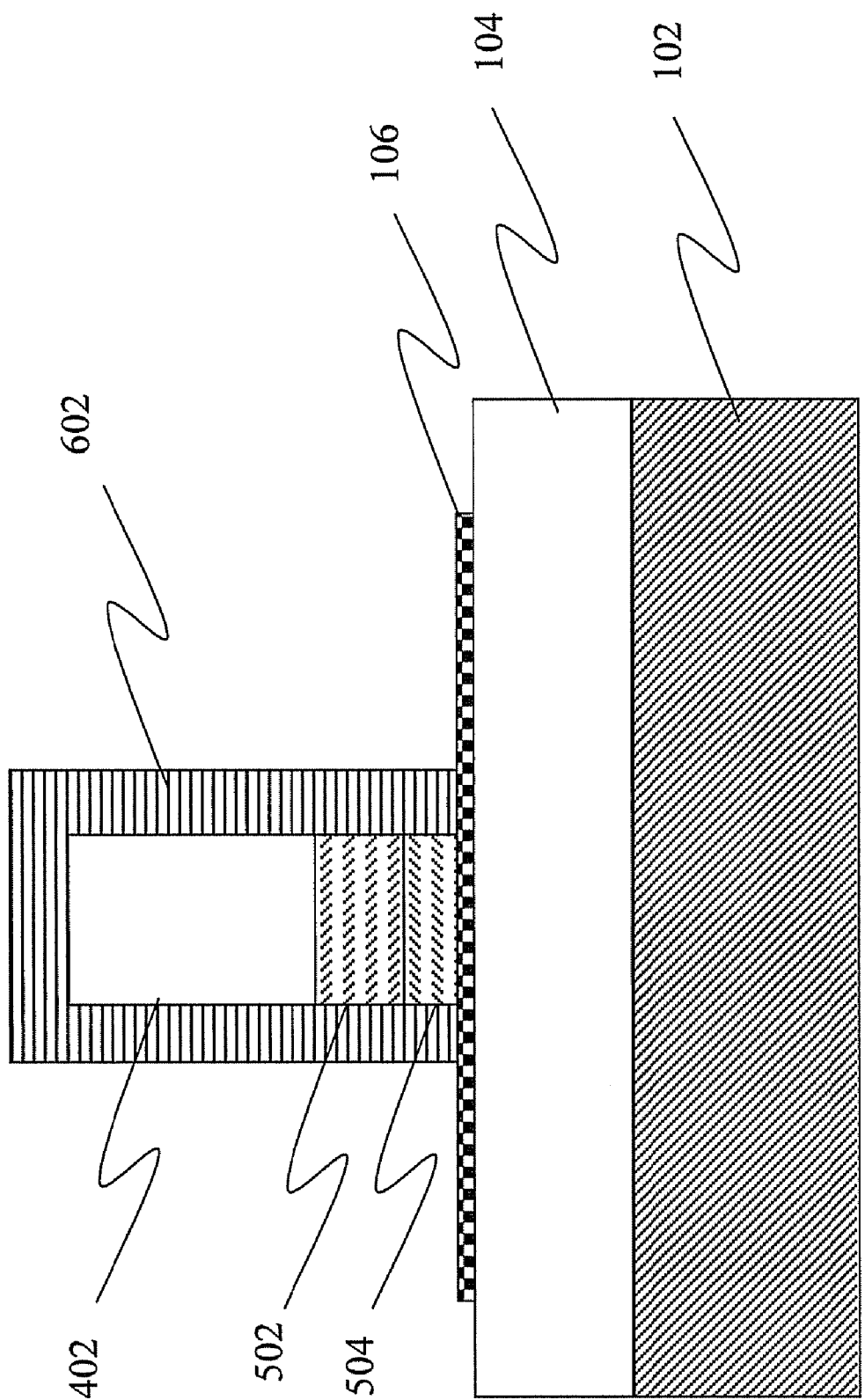

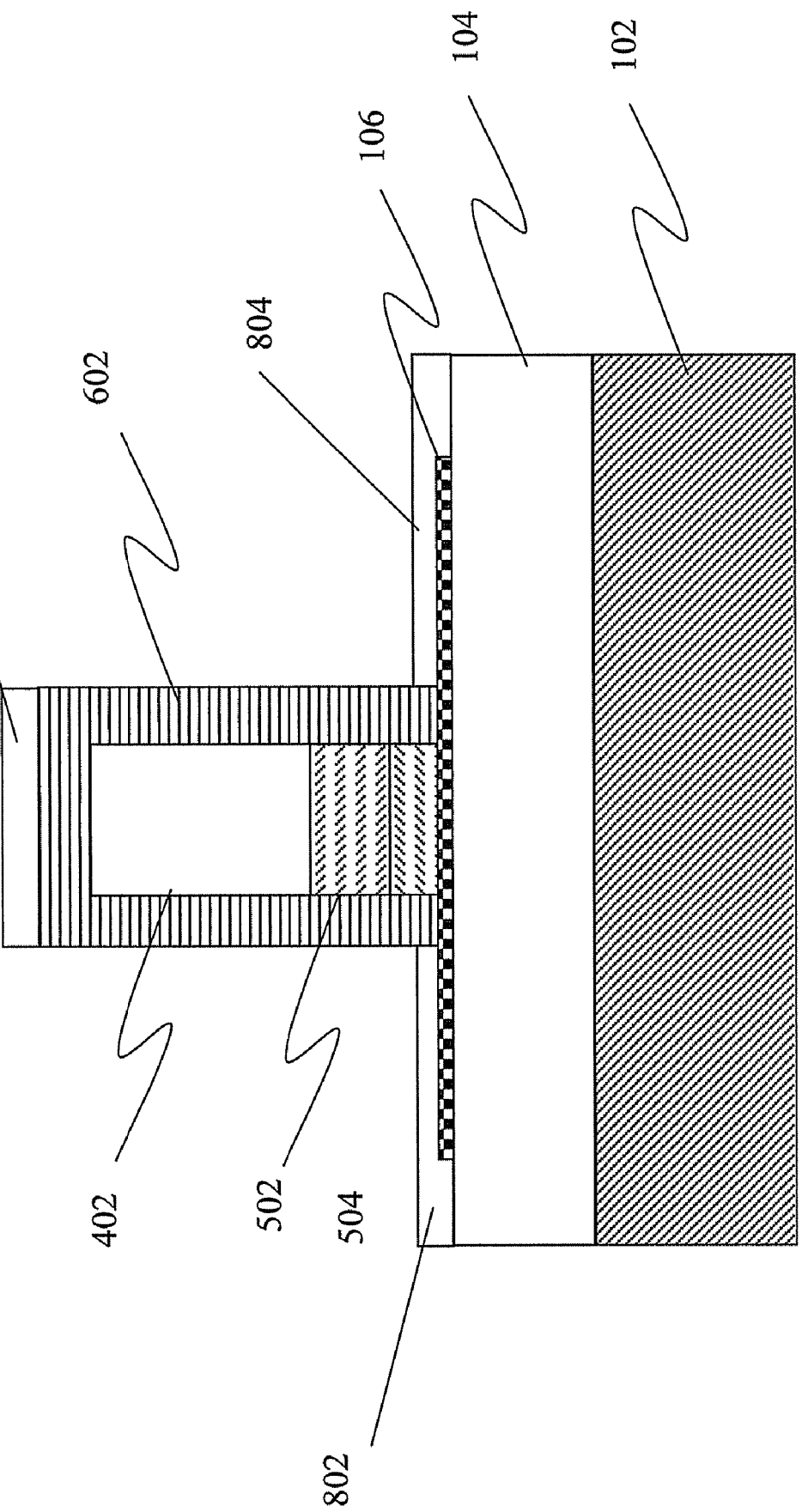

SELF-ALIGNED GRAPHENE TRANSISTOR

This invention was made with Government support under FA8650-08-C-7838 awarded by DARPA. The Government has certain rights in the invention.

BACKGROUND

The present invention relates to transistors, and more specifically, to field effect transistors formed with graphene channels.

Graphene is a one-atom-thick planar sheet of sp2-bonded carbon atoms that are densely packed in a honeycomb crystal lattice. It can be viewed as an atomic-scale chicken wire made of carbon atoms and their bonds.

Graphene possesses great potential for high-speed electronics because of its high carrier mobility and the ultra-thin single atom body thickness. In addition to the carrier mobility, the performance of a transistor also depends on the parasitic capacitance and resistance associated with its terminals. The impact of these parasitic capacitances on device performance becomes particularly important with the shrinking of device dimensions. In order to minimize the parasitic capacitance between source/drain and gate electrodes, it is necessary to maintain a device structure where the gate electrode lies between the source/drain electrodes without overlaps. However, this gap (the un-gated region between source/drain and the gate) gives rise to an access resistance, and contributes to the overall drain-to-channel and source-to-channel parasitic resistances. Therefore, the most desirable transistor structure is a self-aligned device where the gate and the source/drain electrodes align to each other without overlaps and with minimum gaps.

In silicon (Si) MOSFETs, self-aligned FETs are usually realized by forming an oxide side-wall surrounding the gate stack before the formation of source/drain contacts. However, this technique cannot be directly applied in the case of graphene due to the differences in material processing requirements between Si and carbon. Currently, there is no scheme known to fabricate such self-aligned graphene transistors.

SUMMARY

According to one embodiment of the present invention, a graphene field effect transistor is disclosed. The field effect transistor of this embodiment includes a gate stack that includes a seed layer, a gate oxide formed over the seed layer, and a gate metal formed over the gate oxide. The field effect transistor of this embodiment also includes an insulating layer and a graphene sheet displaced between the seed layer and the insulating layer.

According to another embodiment of the present invention, a method of forming a graphene field effect transistor is disclosed. The method of this embodiment includes providing an insulating layer; forming a graphene sheet on the insulating layer; forming a seed layer on the graphene sheet; forming a gate dielectric layer over the seed layer; forming a gate on top of the gate dielectric layer; encapsulating the seed layer, the gate dielectric and the gate in a spacer material to form an encapsulated gate stack; forming a source contact on the graphene sheet on a first side of the encapsulated gate stack; and forming a drain contact on the graphene sheet on a second side of the encapsulated gate stack.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 4 shows the structure of FIG. 3 after a gate has been formed over the oxide layer;

FIG. 5 shows the structure of FIG. 4 after the portions of the seed and oxide layers not covered by the gate have been removed;

FIG. 6a shows the structure of FIG. 4 after the gate, seed layer and oxide layer have been encapsulated by a spacer material;

FIG. 8 shows the structure of FIG. 7 after source and drain contacts have been added.

DETAILED DESCRIPTION

One embodiment of the present invention is directed to a self-aligned, top-gated grapheme field effect transistor (FET) device. In one embodiment, the gate electrode aligns the source/drain electrodes without resorting to any lithographic alignment procedures. In particular, the surface properties of graphene are utilized to form an oxide side-wall around the gate electrode, as described below, thus enabling a self-aligned gate similar to that achieved in state-of-the-art Si MOSFETs through different methods.

It has been known that ALD (atomic layer deposition) oxide cannot be directly deposited on a clean graphene surface. In order to form a uniform oxide layer on graphene using the ALD process, the graphene surface has to be first functionalized or covered with some kind of seed layer. Embodiments of the present invention may take advantage of this unique ability to selectively deposit ALD oxide on graphene depending on the surface configuration. In addition, a method to fabricate top-gated graphene FET with self-aligned source/drain and gate terminals is disclosed.

In general, in one embodiment, a top gate stack consisting of a layer of ALD oxide and metal electrode is formed. The gate metal electrode is then used as the etch mask to remove the oxide and seed layer. This results in a clean graphene surface except for the regions under the gate stack. In a subsequent ALD process, a thin layer of oxide is deposited on the gate stack, leaving the rest of the graphene surface void of any oxide. Source and drain contacts are finally formed on the "clean" graphene region.

It will be understood, that the second oxide coating on the gate stack serves as the spacer between the source/drain and gate electrodes. This spacer creates a minimum un-gated region.

Some of the advantages of the present invention include, but are not limited to, parasitic resistance and capacitance minimization by the self-aligned gating, and hence improving the high frequency performance of the device. In addition, the method disclosed herein takes advantage of the unique surface properties of graphene and is highly manufacturable and scalable. The method does not rely on any lithographic alignment processes to achieve the alignment of source/drain and gate electrodes. High-k ALD oxide may be used as the gate dielectric, which allows for the ultimately nano-scaled graphene FET.

Figure 1:
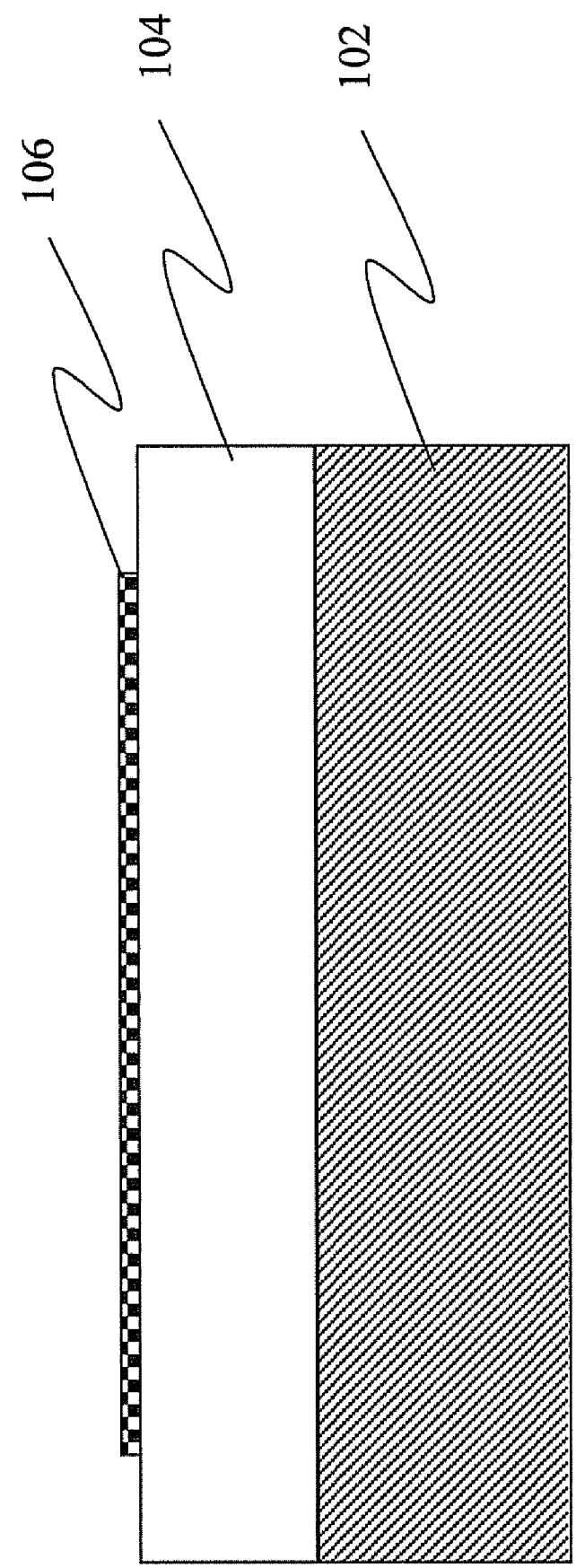
FIG. 1 shows a first processing stage of forming a FET according to one embodiment of the present invention.

With reference now to FIG. 1, an example of a structure in the production process of a FET according to one embodiment of the present invention is shown. The structure includes a substrate 102. The substrate 102 may be formed of any material but, in one embodiment, is formed of silicon. It shall be understood that the substrate 102 may be omitted in some embodiments but may be useful in the event that the grapheme FET is to be integrated with other elements.

An insulating layer 104 is disposed on top of the substrate 102. The insulating layer 104 may be formed of any electrically insulating material. In one embodiment, the insulating layer 104 is formed of an oxide. In another embodiment, the insulating layer 104 is formed of an undoped silicon carbide (SiC) material.

A graphene layer 106 is disposed on top of the insulating layer 104. The graphene layer 106 will ultimately form the source, drain and channel of a FET according to one embodiment. In order to increase transistor switching speed, both the channel length and height (or depth) need to be minimized. Utilizing a grapheme channel provides the minimal (one atom thick) channel height. Utilizing the self-alignment disclosed herein may help reduce the channel length.

The graphene layer 106 may be deposited on the insulating layer 104. In the event the insulating layer 104 is formed of SiC, the graphene layer 106 may be grown directly on the insulating layer. Regardless of how formed, the graphene layer 106 may have a height of only one atom in one embodiment. Of course, the graphene layer 106 could also consist of mono, bi-, or few layer graphene in some embodiments.

In order to form an oxide (gate oxide layer) on the graphene layer 106, the graphene layer must be functionalized. Functionalization shall refer to a process that makes it possible for an oxide to be deposited by ALD on top of the graphene layer 106. One way in which this may be done is to deposit a layer of seed layer by direct physical vapor deposition, such as $Al_2O_3$ formed by the natural oxidation of Al. In the following description, such an additional layer shall be referred to as a seed layer.

Figure 2:
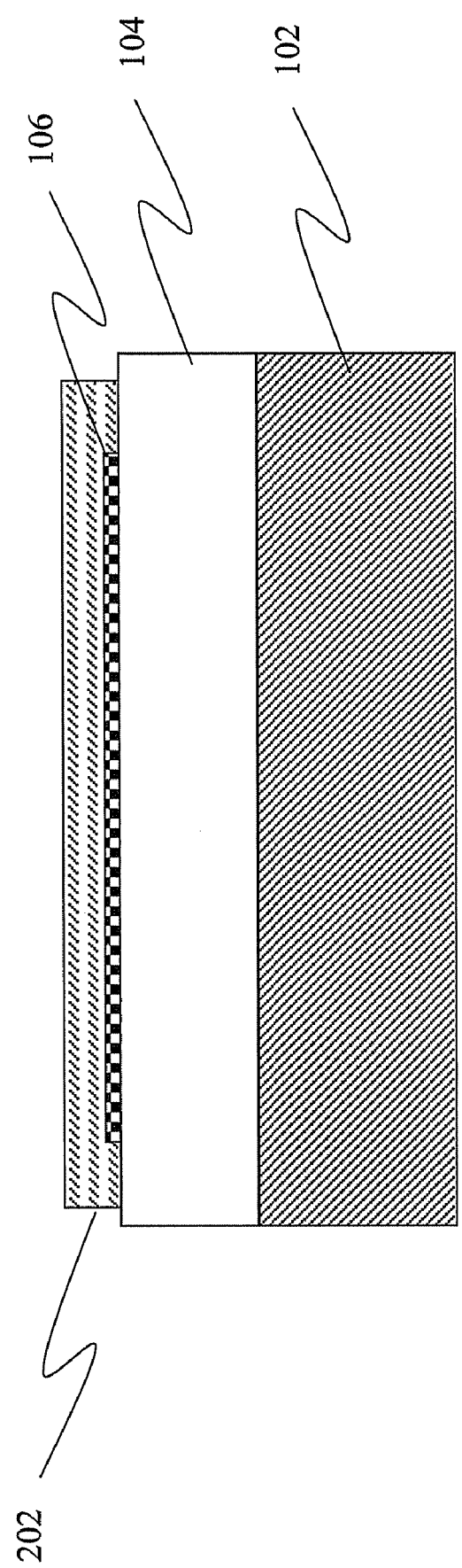
FIG. 2 shows the structure of FIG. 1 after a seed layer has been added.

As shown in FIG. 2, a seed layer 202 is formed on top of the graphene layer 106 and contacts at least a portion of the insulating layer 104. The seed layer 202 may be formed in a variety of manners. For example, the seed layer 202 may be formed by depositing $NO_2$ or spin-coating various polymers onto the graphene layer 106. In another embodiment, a metal may be deposited over the graphene layer 106 by physical vapor deposition (PVD) and then oxidized. For instance, the metal may be aluminum (Al) which, when oxidized, forms aluminum oxide ($Al_2O_3$).

An intrinsic property of graphene is that an oxide cannot be directly formed on graphene. Such a limitation applies to ALD deposition as well. Accordingly, the seed layer 202 allows for an oxide (in this case, a so-called "gate dielectric") to be formed over the graphene layer 106. The process of adding a seed layer 202 shall be referred to herein as "functionalizing" the graphene layer 106. Of course, other methods of functionalizing the graphene layer 106 may be utilized.

After the graphene layer 106 has been functionalized, and as shown in FIG. 4, an oxide layer 302 is formed over the seed layer 202 so that it overlays at least a portion of the graphene layer 106. In one embodiment, the oxide layer 302 is deposited by ALD. The oxide layer 302 may form the dielectric layer of gate. To that end, the oxide layer 302 may be formed of a dielectric material. In one embodiment, the oxide layer 302 may be formed of a high-k dielectric material. The oxide layer 302 may have a thickness ranging from 1 to 20 nm. Of course, this range is not required. The oxide layer 302 may be formed, for example, of halfnium oxide ($HfO_2$), zirconium oxide ($ZrO_2$), or $Al_2O_3$.

Figure 3:
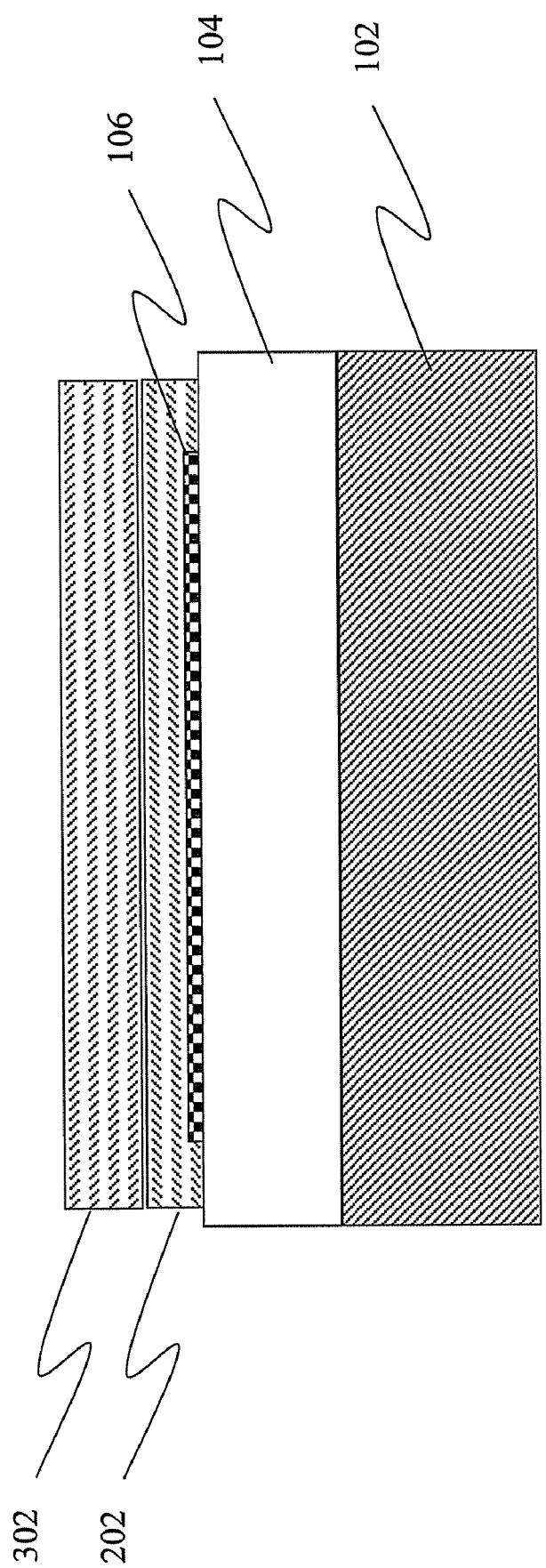
FIG. 3 shows the structure of FIG. 2 after an oxide layer has been formed on the seed layer.

FIG. 4 shows the structure of FIG. 3 after a gate electrode 402 has been formed. The gate electrode 402 may be formed of a metal in one embodiment. In one embodiment, metal is deposited as the gate electrode 402 by lithography and lift-off. Of course, other methods of forming the gate may be utilized.

FIG. 5 shows the structure of FIG. 4 after portions of the oxide layer 302 and seed layer 202 not covered by the gate electrode 402 have been removed. The remaining portion of the oxide layer 302 forms a gate dielectric 502 under which is a thin seed layer portion 504. The oxide layer may be removed by etching and the seed layer may be removed in solvents or chemicals. In one embodiment, the thin seed layer portion 504 is thin enough that it will not interfere with the operation of the graphene layer 106 when a gate voltage is applied to the gate electrode 402.

FIG. 6a shows the structure of FIG. 5 after a gate spacer 602 has been formed around the gate electrode 402, the gate dielectric 502 and the thin seed layer portion 504 (collectively, the gate stack). To form the spacer 602 on the gate stack, an ALD process is again employed to deposit a layer of thin oxide surrounding the gate stack. Note that since the seed layer is removed everywhere else on the substrate, no oxide is deposited on the graphene layer 106. That is, the spacer 602 does not adhere to the graphene layer 106. This allows for the source and drain contacts to be made in the subsequent processes without having to perform any patterning or etching. Thus, the length of the channel is defined by the length of the gate stack. The distance between the gate stack and the source and drain is defined by the thickness of the spacer 602.

Figure 6B:
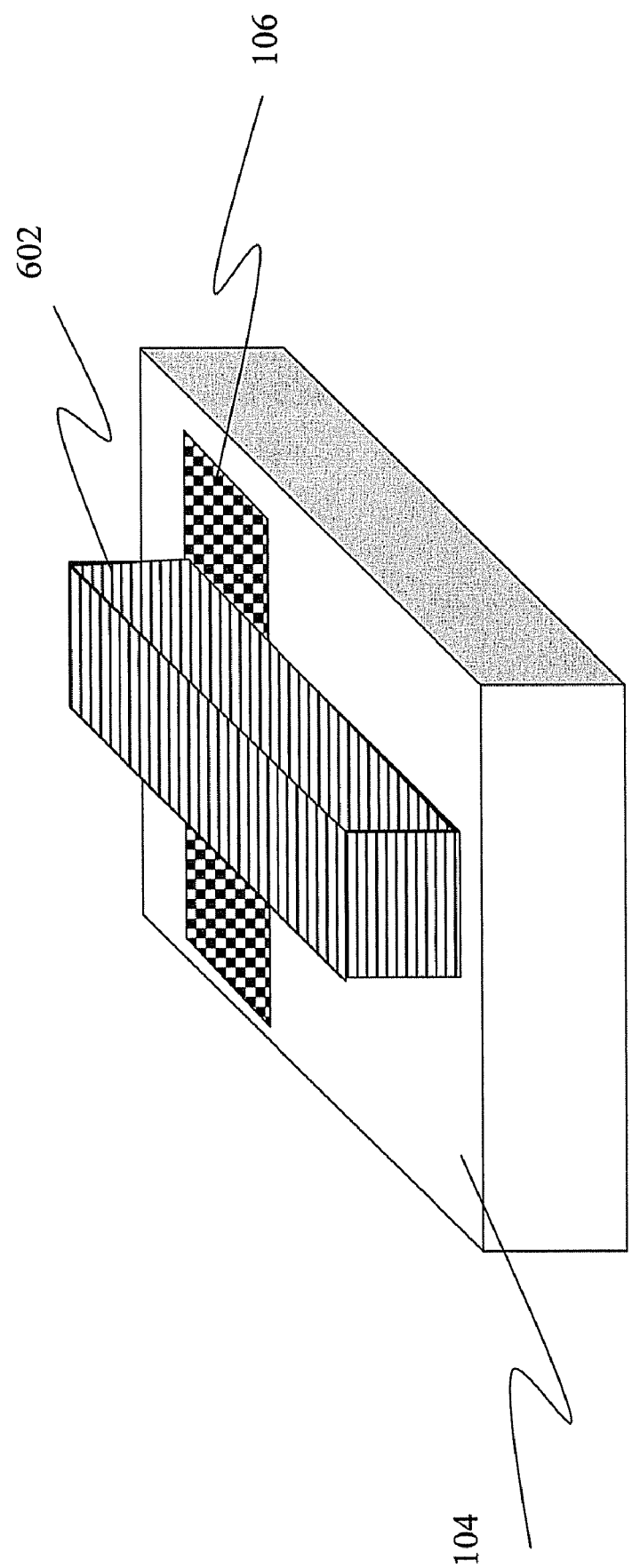
FIG. 6b shows the structure of FIG. 6a in three dimensions.

FIG. 6b is a three dimensional depiction of the structure shown in FIG. 6a. For purposes of FIG. 6b it is assumed that the spacer 602 is deposited substantially only in the area of the gate stack. Of course, the spacer 602 could be deposited on other portions of the insulating layer 104 as well. It should be noted that the spacer 602 is not present over the graphene layer 106. As discussed above, most materials will not stick to graphene. As the exposed portions of the graphene layer 106 will form the source and drain, the gate stack aligns the location thereof. Accordingly, the source and drain are self-aligned with the gate.

Figure 7:
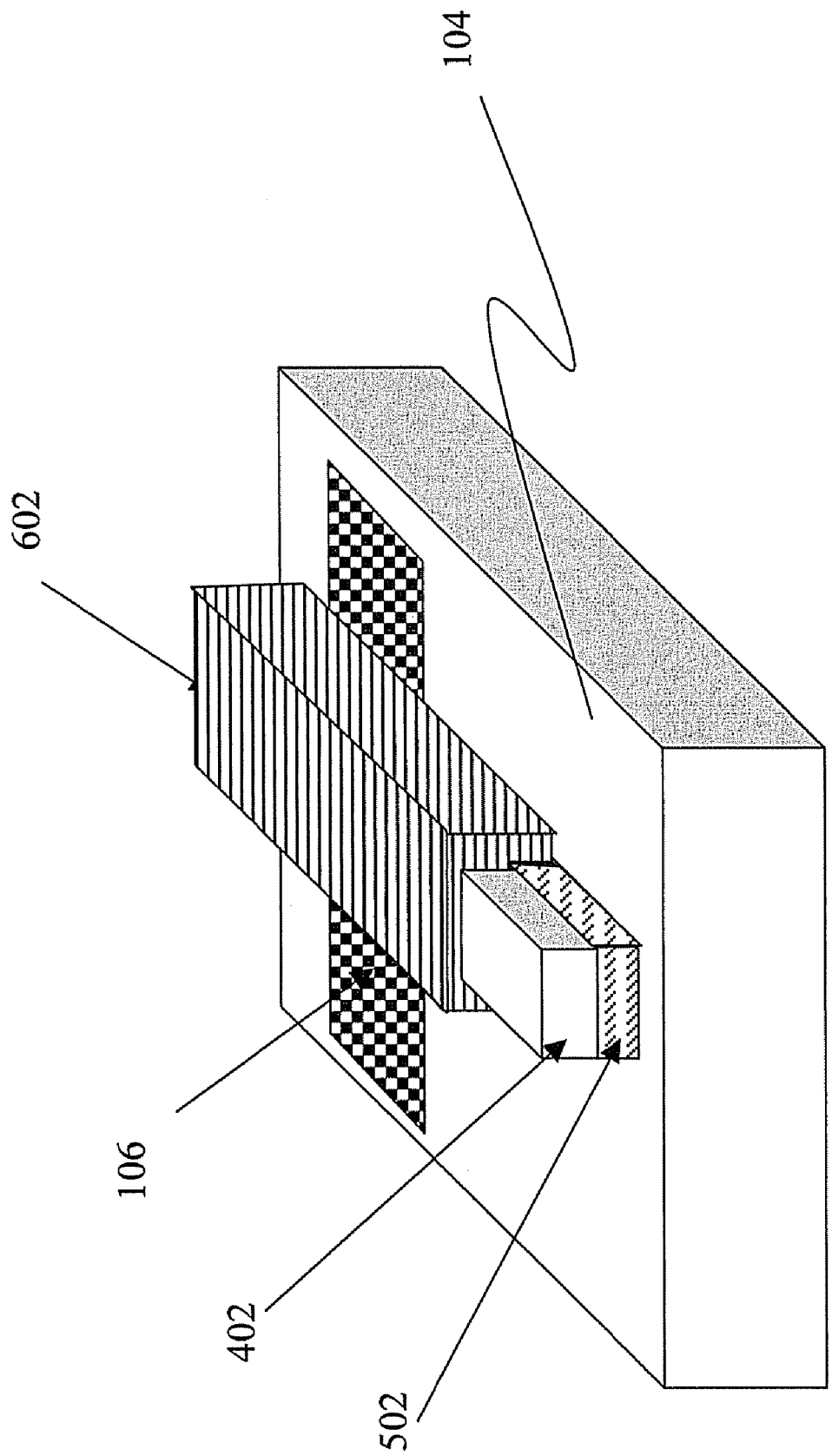
FIG. 7 shows the structure of FIG. 6b after portions of the spacer material have been removed.

FIG. 7 shows the structure of FIG. 6b after a portion of the gate spacer 602 has been removed to expose the gate electrode 402. The oxide that forms the gate spacer 602 may be removed, for example by lithography and etching. The gate spacer 602 is removed to allow for electrical contact with the gate electrode 402.

FIG. 8 shows the structure of FIG. 7 after the gate stack and graphene layer 106 have been covered with an electrode material. The electrode material is shown by electodes 802, 804 and 806. Electrodes 802 and 804 may form source and drain contacts of a FET. The ungated area (defined as the portion of the graphene layer 106 under the spacer 602) has minimal dimensions. This allows for a FET having a channel length that where a majority of the length is comprised by the gate. That is, the only limit on reducing the channel length is the minimal gate length required.

The source and drain contacts (802/804) to the graphene layer 106 are made by depositing a thin layer of metal on the "clean" graphene layer 106, as shown in FIG. 9. Unlike oxides, metal electrodes do not require a seed layer or functionalization agents to adhere to graphene. Note that the oxide spacer 602 ensures that the source, drain and gate contacts are not electrically shorted. The final structure is a self-aligned, top-gated graphene FET where the gate is separated from the source/drain region by a side-wall, the thickness of which is smaller than the alignment resolution that can be achieved by any state-of-the-art lithography.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A graphene field effect transistor comprising: a gate stack, the gate stack including a seed layer, a gate oxide formed over the seed layer, and a gate metal formed over the gate oxide; an insulating layer; and a graphene sheet disposed between the seed layer and the insulating layer, further comprising: a spacer formed on a top and both sides of the gate stack.

2. The graphene field effect transistor of claim 1, further comprising:
a source contact formed on the graphene sheet and separated from the gate stack by the spacer; and a drain contact formed on the graphene sheet and separated from the gate stack by the spacer.

3. The graphene field effect transistor of claim 1, wherein the graphene sheet is deposited on the insulating layer.

4. The graphene field effect transistor of claim 1, wherein the graphene sheet is grown on the insulating layer.

5. The graphene field effect transistor of claim 1, wherein the seed layer is one of: $NO_2$, a polymer and an oxidized metal film.

6. The graphene field effect transistor of claim 1, wherein the gate oxide is a dielectric.

7. The graphene field effect transistor of claim 6, wherein the dielectric is a high-k dielectric.

8. The graphene field effect transistor of claim 1, further comprising:
a spacer formed on a top and both sides of the gate stack, the spacer having a portion removed to expose a portion of the gate metal.

9. A method of forming a graphene field effect transistor, the method comprising:
providing an insulating layer;
forming a graphene sheet on the insulating layer;
forming a seed layer on the graphene sheet;
forming a gate dielectric layer over the seed layer;
forming a gate on top of the gate dielectric layer;
encapsulating the seed layer, the gate dielectric and the gate in a spacer material to form an encapsulated gate stack;
forming a source contact on the graphene sheet on a first side of the encapsulated gate stack; and
forming a drain contact on the graphene sheet on a second side of the encapsulated gate stack.

10. The method of claim 9, wherein the graphene sheet is grown on the insulating layer.

11. The method of claim 9, wherein the seed layer functionalizes the graphene sheet.

12. The method of claim 9, wherein the seed layer is one of: $NO_2$, a polymer and an oxidized metal film.

13. The method of claim 9, wherein the gate dielectric is a high-k dielectric.

14. The method of claim 9, wherein encapsulating includes:
performing an ALD deposition of an oxide over the gate stack and the graphene sheet.

15. The method of claim 14, wherein the ALD deposited oxide does not adhere to the graphene sheet.

16. The method of claim 9, wherein a length of the channel is defined by the length of the gate and the thickness of the spacer material.

17. The method of claim 9, wherein the source contact is separated from the gate by the spacer material.

* * * * *